United States Patent [19]

Alpaiwalla et al.

[11] Patent Number: 4,742,249
[45] Date of Patent: May 3, 1988

[54] RF SWITCH WITH DIODE NETWORK AND CONTROL LATCH SHARING COMMON ELEMENT

[75] Inventors: Feroz K. Alpaiwalla; Robert H. Begeman, both of Indianapolis, Ind.

[73] Assignee: RCA Licensing Corporation, Princeton, N.J.

[21] Appl. No.: 934,965

[22] Filed: Nov. 25, 1986

[51] Int. Cl.⁴ .................. H03K 17/60; H03K 17/74
[52] U.S. Cl. ................................ 307/255; 307/243; 307/259; 307/288
[58] Field of Search .................. 307/254–259, 307/243, 288

[56] References Cited

U.S. PATENT DOCUMENTS

| | | | |
|---|---|---|---|
| 3,047,741 | 7/1962 | Snow | 307/243 |
| 3,235,750 | 2/1966 | Anderson et al. | 307/259 |
| 3,665,220 | 5/1972 | Legler et al. | 307/256 |
| 3,902,079 | 8/1975 | Ahmed | 307/255 |
| 3,952,212 | 4/1976 | Matsumoto et al. | 307/255 |
| 4,031,412 | 6/1977 | Ohhinata et al. | 307/255 |
| 4,035,669 | 7/1977 | Yokoyama | 307/255 |
| 4,400,735 | 8/1983 | Strammello, Jr. | 358/181 |

Primary Examiner—Stanley D. Miller
Assistant Examiner—B. P. Davis
Attorney, Agent, or Firm—Paul J. Rasmussen; Peter M. Emanuel; Richard G. Coalter

[57] ABSTRACT

A diode network includes a series branch coupled between two signal ports and a shunt branch coupled between a node in the series branch and ground and connected in parallel with a transistor of a latching circuit that is further coupled to supply forward bias to the shunt branch and reverse bias to the series branch when the transistor is conductive for blocking RF signal flow between the ports. The bias applied to the branches is reversed when the latch transistor is non-conductive thereby enabling RF signal flow between the ports. The transistor provides plural functions of establishing positive feedback for the latch, supplying forward and reverse bias to the shunt and series branches, respectively, and enhancing the attenuation of the shunt branch when conductive.

7 Claims, 4 Drawing Sheets

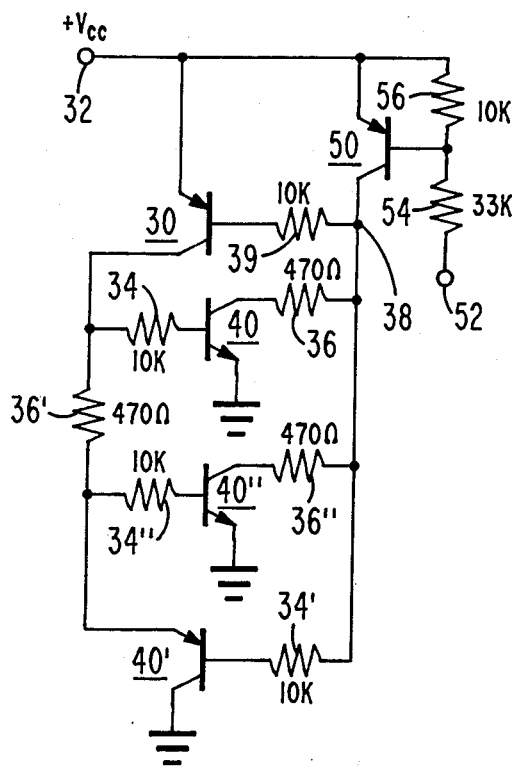
Fig. 5
| INPUT 52 | LOW | OPEN |
|---|---|---|
| NODE 38 | HIGH | LOW |
| TRANS. 30 | OFF | ON |
| TRANS. 40 | OFF | ON |
| TRANS. 40" | OFF | ON |
| TRANS. 40' | ON | OFF |
Fig. 6
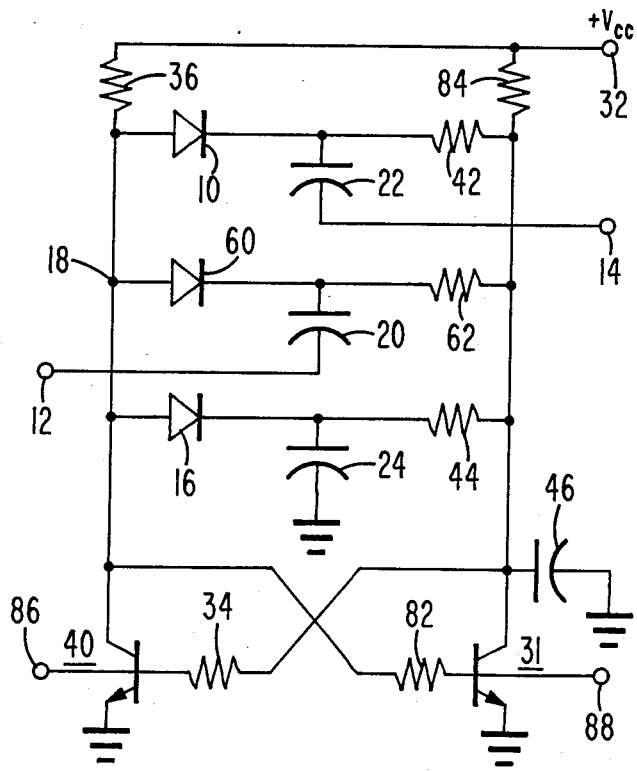
Fig. 7

RF SWITCH WITH DIODE NETWORK AND CONTROL LATCH SHARING COMMON ELEMENT

FIELD OF THE INVENTION

This invention relates to radio frequency (RF) switches of the type employing a diode network for selectively coupling an RF signal between input and output ports of the switch and which includes a latching circuit for applying control bias to the diode network.

BACKGROUND OF THE INVENTION

Radio frequency switches of the diode network type are of general utility. In television receivers, for example, such switches are frequently used to selectively couple antenna and auxiliary signal sources to the receiver tuner and to provide a so-called "loop through" function for switching the antenna input to another device such as a cable decoder or a video cassette recorder. An example of an RF switch providing these functions is described by Strammello, Jr. in U.S. Pat. No. 4,400,735 entitled MULTI-COMPONENT VIDEO SYSTEM CONTROLLER which issued Aug. 23, 1983. Each individual RF switch in the Strammello Jr. controller employs series and shunt diodes connected in a T-network configuration. When the switch is "OFF" (i.e., not passing a signal) the series diodes are reverse biased and exhibit a small capacitance while the shunt diodes are forward biased and exhibit a relatively low resistance thereby attenuating signal flow between input and output ports of the switch. The switch is turned "ON" by applying forward bias to the series diodes and reverse bias to the shunt diodes of the T-network. To provide high attenuation in such a switch generally requires a relatively high reverse bias for the series diodes and a large forward bias current for the shunt diode. These measures, however, have the attendant disadvantage of relatively high power dissipation. Additionally, cascading diode network sections to improve the attenuation is expensive and undesirably increases the switch transmission losses in the ON state.

Another example of a diode network RF switch is described by Snow in U.S. Pat. No. 3,047,741 entitled MULTIPLE CHANNEL ELECTRONIC SWITCHING CIRCUIT which issued July 31, 1962. The Snow switch employs series type diode networks for RF switching and features a latching circuit comprising Shockley or NPNP type trigger diodes for generating the switch bias voltage. By this means the switch is provided with a "memory", so to speak, for maintaining the switch in its ON or Off state and so the switch requires only momentary applications of drive current to change its state. The attenuation of the switch in the off state suffers, however, because of the lack of a shunt branch in the switch and relatively complex gating circuits are required for controlling the trigger diodes.

SUMMARY OF THE INVENTION

It is herein recognized that a need exists for an RF switch of "L", "T" or "Pi" diode network configuration having improved attenuation and which does not require the continuous application of control signal for maintaining the switch in an OFF state. The present invention is directed to meeting this need.

An RF switch embodying the invention comprises a diode network and a latching circuit. The network includes a series branch coupled between first and second signal ports and a shunt branch coupled between a circuit node in the series branch and a source of reference potential. The latching circuit includes a pair of transistors having respective control electrodes and conduction paths cross-coupled to provide positive feedback therebetween such that each transistor of the pair controls the conductive state of the other, the latching circuit having a first state in which one transistor of the pair is conductive and a second state in which the one transistor is non-conductive. A circuit means couples the conduction path of the one transistor in parallel with the shunt branch of the diode network. A bias means, responsive to the first state of the latching circuit, applies forward bias to the shunt branch and reverse bias to the series branch of the diode network and reverses the bias applied to the branches in response to the second state of the latching circuit.

In accordance with a further aspect of the invention the transistors of the latching circuit are of complementary types tending to bias each other on in response to the feedback and means are provided for interrupting the feedback in response to a control signal for biasing the complementary transistors off.

BRIEF DESCRIPTION OF THE DRAWING

The foregoing and further features of the invention are illustrated in the accompanying drawing in which like elements are denoted by like reference designators and in which:

FIG. 5 is a schematic diagram of a portion of the RF switching system of FIG. 4 redrawn for purposes of illustration and explanation;

FIG. 6 is a table listing of signal and transistor states associated with FIGS. 4 and 5; and FIG. 7 is a schematic diagram of an RF switch embodying the invention employing a diode T-network and a latching circuit employing non-complementary transistors.

DETAILED DESCRIPTION

Figure 1:
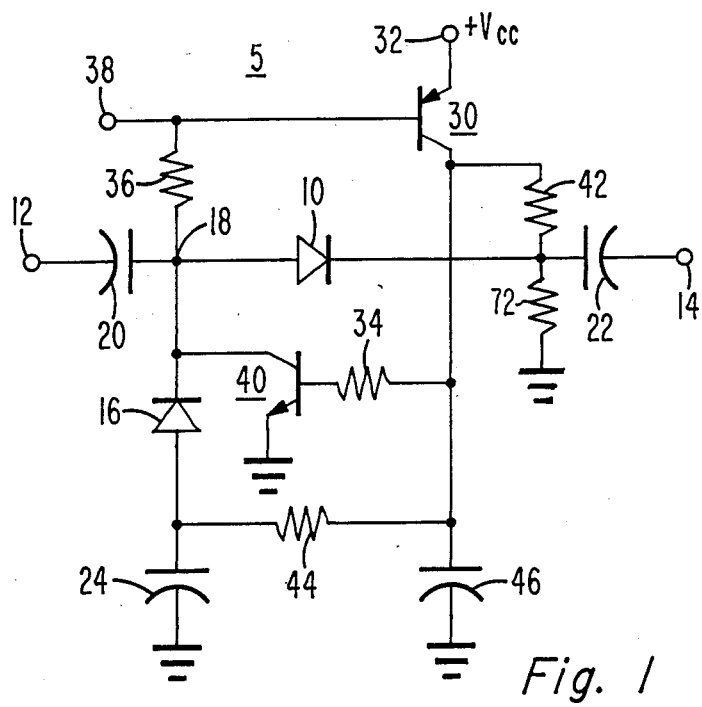
FIG. 1 is a schematic diagram of an RF switch embodying the invention employing a diode L-network.

The RF switch 5 of FIG. 1 includes a diode L-network having a series branch including diode 10 coupled between two RF signal ports 12 and 14 and a shunt branch including diode 16 coupled between a circuit node 18 in the series branch and ground. More specifically, in the series branch a circuit node 18 is coupled to RF signal port 12 via a DC blocking capacitor 20 and to the anode of diode 10 which is coupled at the cathode thereof to RF signal port 14 via another DC blocking capacitor 22. In the shunt branch the cathode of diode 16 is connected to node 18 and the anode of diode 16 is coupled to ground via an AC coupling capacitor 24.

RF switch 5 also includes a latching circuit comprising a pair of complementary transistors 30 and 40 having respective control electrodes and conduction paths cross-coupled to provide positive feedback therebetween such that each transistor of the pair controls the conductive state of the other. Specifically, PNP transistor 30 is connected at the emitter thereof to a supply terminal 32 for receiving a positive supply voltage Vcc and is coupled at the collector thereof to the base of NPN transistor 40 via a resistor 34. The conduction path of transistor 40 is connected in parallel with the shunt branch (16,24) of the diode network by means of a connection of the emitter of transistor 40 to ground and a connection of its collector to circuit node 18 in the series branch which, in turn, is coupled via a further resistor 36 to a control terminal 38 and to the base electrode of PNP transistor 30. The collector electrode of PNP transistor 30 is also coupled to the cathode of diode 10 via a resistor 42, to the anode of diode 16 via a resistor 44 and to ground via a capacitor 46.

In operation, transistors 30 and 40 assume a latched condition with both transistors conducting current or "turned on" when control terminal 38 is open circuited as shown. This results because of the positive feedback via resistors 34 and 36 which cross-coupled the collector and base electrodes of the transistors. Specifically, current coupled from the collector of transistor 30 via resistor 34 to the base of transistor 40 will bias transistor 40 on which, in turn, feeds turn-on bias back to the base of transistor 30 via resistor 36.

It will be noted that the latch (30, 40) will always assume a latched condition when terminal 38 is open circuited because there is a DC path to ground from the base of PNP transistor 30 that serves as a "start-up" circuit. Specifically, when no signal is applied to terminal 38, base current will flow from transistor 30 to ground via the path including resistor 36, diode 10, resistor 42, resistor 34 and the base-emitter junction of NPN transistor 40. This "start-up" current will bias transistor 30 on which, in turn, will bias transistor 40 on as previously explained with each supplying turn-on current to the other via the collector-to-base cross-coupling resistors 34 and 36.

In the latched condition transistor 40 saturates clamping circuit node 18 in the series branch of the diode network to ground. Concurrently, resistor 42 applies reverse bias to the cathode of diode 10 in the series branch and resistor 44 applies forward bias to the anode of diode 16 in the shunt branch. Accordingly, in this state of the latch (30, 40) an RF input signal applied to port 14 will be blocked by reverse biased diode 10 in the series branch of the diode network. Some leakage the RF signal through diode 10 to port 12 will tend to occur because of the inherent capacitance of the diode. However, this "leakage" signal component is attenuated to a negligible level by the combined action of forward biased diode 16 in the shunt branch and the very low collector saturation resistance of transistor 40 connected in parallel with diode 16.

It is a feature of the invention that transistor 40, being connected as shown, provides four functions relating to latch control and achieving high attenuation in switch 5. First, transistor 40 supplies positive feedback to transistor 30 for maintaining the latched condition in which both transistors are saturated. Second, the saturated collector voltage establishes the reverse bias voltage for diode 10. Third, transistor 40 conducts the forward bias for shunt diode 16. Forth, the low saturation resistance of transistor 40, being in parallel with the on-resistance of diode 16, provides a parallel combination of particularly low impedance which reduces the leakage signal component of the series branch to negligible levels.

RF switch 5 is turned on for conducting a signal between ports 14 and 10 by turning transistors 30 and 40 off. This requires interrupting the positive feedback between transistors 30 and 40. This may be done by short circuiting the base-emitter junctions of either transistor. In switch 5 the specific means for interrupting the feedback comprises control terminal 38 coupled to the base electrode of transistor 30. By applying a positive voltage to this terminal (approximately equal to Vcc) transistor 30 will turn off thereby turning transistor 40 off. This may be facilitated by connecting the collector-emitter path of a control transistor between terminals 38 and 32 and biasing the control transistor ON. Subsequent examples of the invention use this technique for turning transistors 30 and 40 off.

When transistors 30 and 40 are turned off (i.e., non-conductive) resistor 36 applies a positive voltage to node 18 coupled to the anode of diode 10 and the cathode of diode 16. Since the cathode of diode 10 is coupled to ground via the path including resistor 42, resistor 34 and the base-emitter junction of transistor 40, diode 10 will be forward biased to conduct an RF signal between ports 14 and 12 of switch 5. The forward bias may be increased by coupling a load resistor 72 between the cathode of diode 10 and ground as shown. Concurrently, diode 16 is reverse biased by the positive potential at node 18 applied to its cathode and the DC path through resistors 44 and 34 and the base emitter junction of transistor 40 to ground. With diode 10 on and diode 16 and transistor 40 off, the RF signal passes between signal ports 14 and 12 without significant attenuation other than the forward resistance of the single diode 10 in the series branch which is very low.

Switch 5 employs diodes connected in an "L-network" as previously noted. When the switch is OFF a low impedance to ground is presented at port 12 and port 14 is essentially open circuited. Either of ports 12 and 14 may be used as an input or an output for conventional RF signal sources. If the signal source impedance is extremely low (i.e., comparable to the ON resistance of diode 16 in parallel with the saturation resistance of transistor 40) then port 14 should be used as the input to avoid excessive current flow from the source when switch 5 is turned off.

Figure 2:
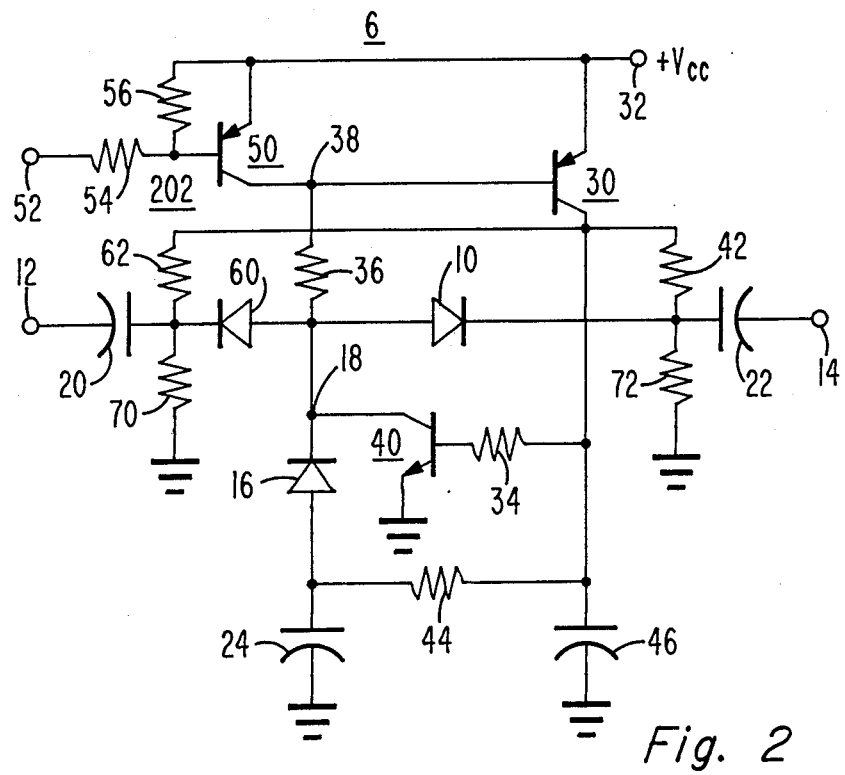
FIG. 2 is a schematic diagram of an RF switch embodying the invention employing a diode T-network.

The RF switch 5 of FIG. 1 employing a diode L-network may be modified as shown in FIG. 2 to employ a diode T-network. Other changes include the addition of an input circuit 202 for interrupting the feedback between the latch transistors 30 and 40 and input/output load resistors and the addition of load resistors for increasing the supply of forward bias to the series branch of the T-network. The T-network has two advantages over the L-network, namely: (1) it provides higher attenuation in the OFF state and (2) either port may be used as an input or an output without regard to the signal source impedance because both ports are isolated from the shunt branch when the switch 6 is OFF.

The control modification comprises the addition of PNP transistor 50 connected at the emitter and collector electrodes thereof to supply terminal 32 and input terminal 38 and having a base electrode coupled to a further input terminal 52 via resistor 54 and to supply terminal 32 via resistor 56. The L-network to T-network modification comprises the addition of a further diode 60 between node 18 and capacitor 20 with the common connection thereof (cathode of diode 60) coupled to the collector of transistor 30 via a bias resistor 62. The load modification comprises the addition of load resistors 70 and 72 coupled between the cathodes of diodes 60 and 10, respectively, and ground.

Operation of the T-network switch 6 is similar to the L-network switch 5 previously described except that there are now two diodes in the series branch which isolate ports 12 and 14 from node 18 when the switch 5 is off (i.e., when transistors 30 and 40 are ON). Since both ports are isolated, either port may be used as an input or an output without regard for the impedance of the RF signal source and additional attenuation is provided by the added diode. The additional load resistors 70 and 72 counteract the increase in switch ON impedance due to the addition of diode 60 by providing additional load current for the diodes.

Transistor 50 interrupts the feedback for latch transistors 30 and 40 by clamping the base of transistor 30 to the supply voltage terminal 32 in response to a ground level control signal at terminal 52. This turns transistors 30 and 40 off, reverse biases diode 16 and forward biases diodes 10 and 60 which turns switch 6 ON. Turn-off of switch 6 results when terminal 52 is open-circuited thereby turning transistor 50 OFF and enabling the positive feedback between transistors 30 and 40 which causes these transistors to both latch on, as previously explained, thereby turning switch 6 OFF. In the OFF state diodes 10 and 60 are reversed biased by transistor 40 and resistors 62 and 42 and diode 16 is forward biased by resistor 44 which is in parallel with the very low saturation resistance of transistor 40.

Figure 3:
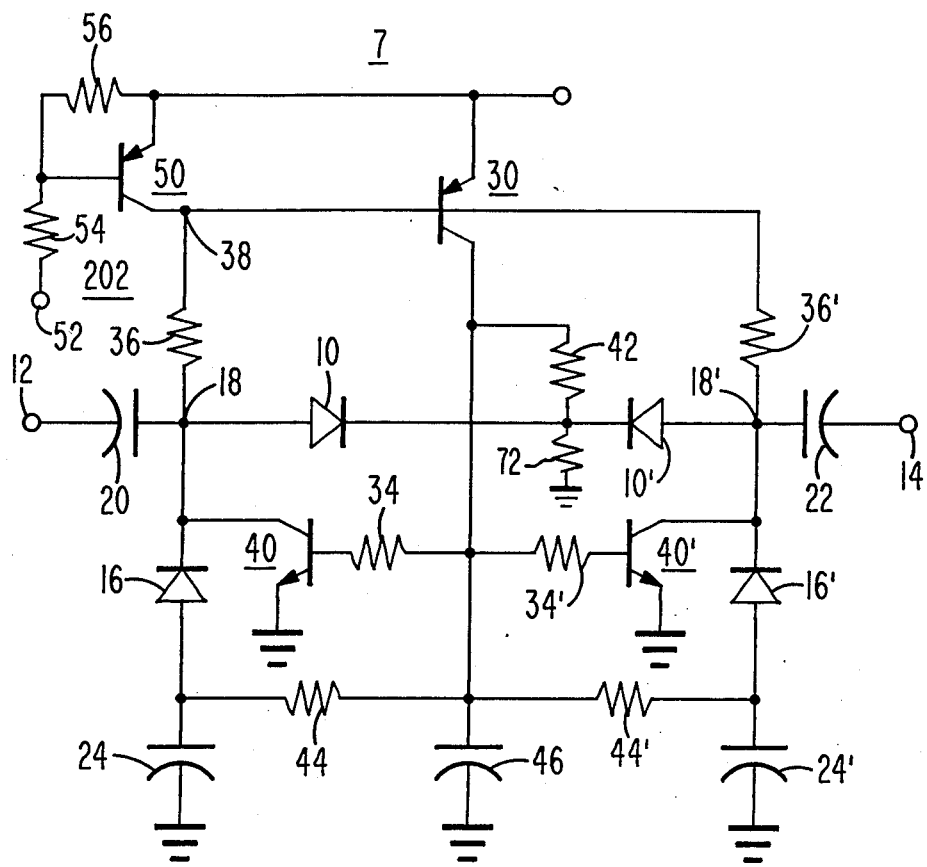
FIG. 3 is a schematic diagram of an RF switch embodying the invention employing a diode Pi-network.

The RF switch of FIG. 1 employing a diode L-network may be modified as shown in FIG. 3 to employ a Pi-network. Other changes include the addition of the control circuit 202 connected and performing the same functions as in the example of FIG. 2. The L-network to Pi-network conversion comprises adding a further diode 10′ in the series branch between diode 10 and capacitor 22, coupling the anode of diode 10′ (node 18′) to the collector of transistor 30 via resistor 36′ and to ground via transistor 40′ and V12 the series connection of a further shunt diode 16′ and capacitor 24′. Base bias for transistor 40′ and anode bias for diode 16′ is provided by resistors 34′ and 44′, respectively, which are coupled to the collector of transistor 30.

In operation, the primed elements perform the same functions as the un-primed elements in the example of the invention of FIG. 1 as previously described. This example differs principally in that there are two shunt branches rather than one with each of the shunt transistors 40 and 40′ being connected in a positive feedback relationship with PNP transistor 30 with the collector and base electrodes of transistor 30 being connected to the base and collector electrodes of both of the NPN transistors 40 and 40′. When transistors 30, 40 and 40′ are ON, nodes 18 and 18′ are coupled to ground via the respective parallel paths (i.e., 16 and 40 for node 18, 16′ and 40′ for node 18′) and series diodes 10 and 10′ are both reverse biased. Turn-off of transistor 30 by control circuit 201 disables shunt transistors 40 and 40′ and reverses the polarity of bias applied to the series diodes 10 and 10′ and shunt diodes 16 and 16′.

Figure 4:
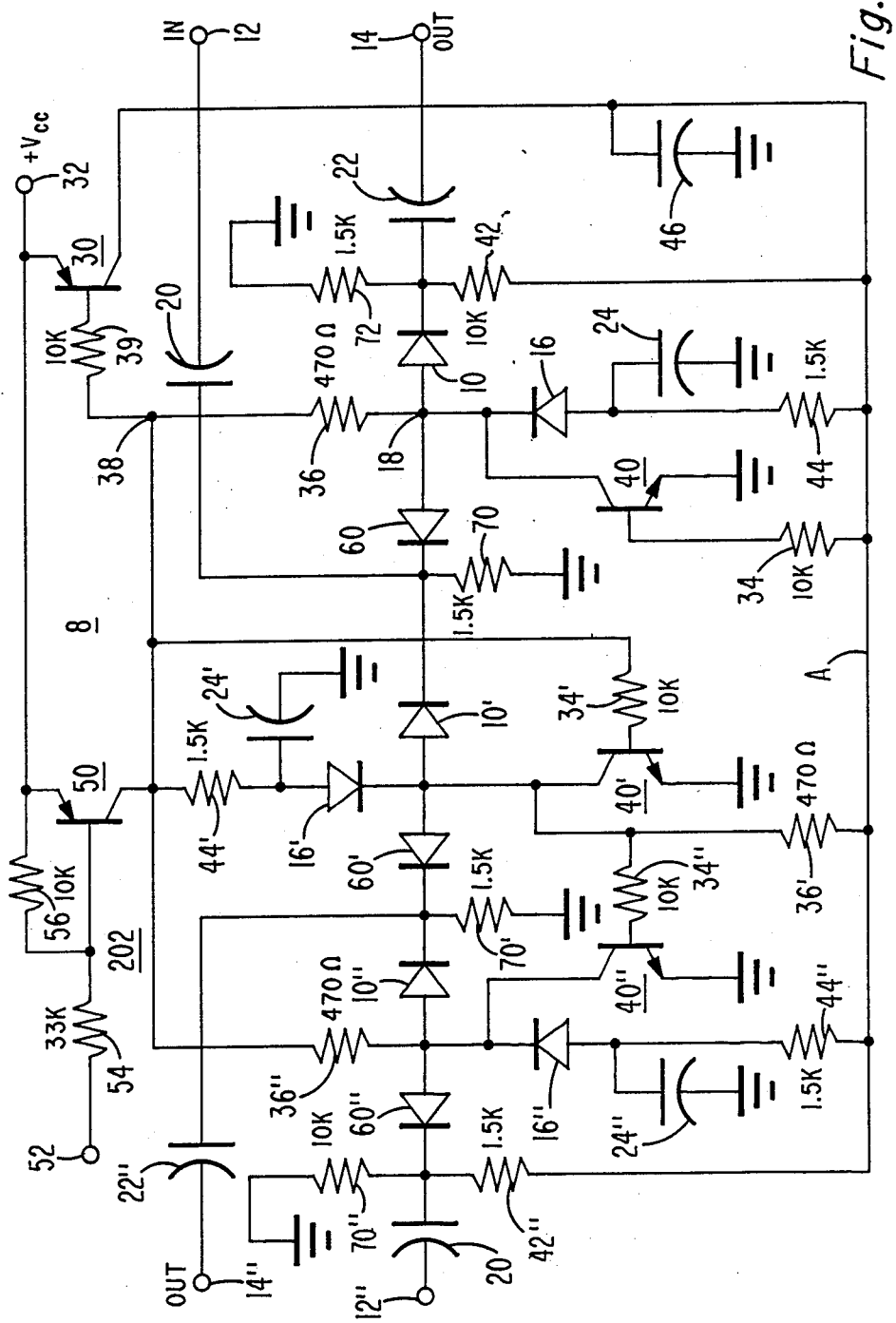
FIG. 4 is a schematic diagram of a multiport RF switching system embodying the invention employing plural diode T-networks and including exemplary component values.

The RF switching system 8 of FIG. 4 employs three of the T-network switches of FIG. 2 for providing switching between four ports 12, 14, 12″ and 14″ and illustrates how some components (e.g., coupling capacitors and load resistors) may be eliminated and others shared (circuit 202 and transistor 30) when plural networks embodying the invention are combined. Exemplary resistor values are shown in the drawing. Suitable capacitor values are 0.01 micro-Farads. The T-network switches having double primed and un-primed designators are connected and function as in the example of FIG. 2 for coupling RF signals between ports 12 and 14 and ports 12″ and 14″, respectively. The T-network having singly primed elements couples signal between ports 14″ and 12 but differs from the other switches in that transistor 40′ is controlled by transistor 50 rather than transistor 30. Thus, when transistors 40 and 40″ in the end switches are ON the transistor 40′ of the center switch is off and vice versa.

In operation, turn-on of transistor 50 biases transistor 40′ and diode 16′ on and reverse biases diodes 10′ and 60′. Concurrently the feedback to transistor 30 is interrupted thereby turning transistors 40 and 40″ off, forward biasing diodes 10, 60, 10″ and 60″ and reverse biasing diodes 16 and 16″. In this condition RF signals applied to ports 12 and 12″ are coupled to ports 14 and 14″, respectively. Turn-off of transistor 50 biases transistor 40′ off and enables the positive feedback which biases transistors 30, 40 and 40″ On and concurrently reverses the polarity of the bias applied to all series and shunt diodes. In this condition, RF signal at port 12 is coupled to port 14″ and the remaining ports 14 and 12″ are isolated.

FIG. 5 is a schematic diagram providing further illustration of the DC operation of the transistors of FIG. 4. As shown, transistors 30 and 40 are cross-coupled to form a latching circuit controlled by transistor 50 as in the example of FIG. 2. When input 52 is open transistor 50 is biased off by resistor 56. This enables current to flow from the base of PNP transistor 30 to ground via resistors 39 and 34′ and the base-emitter path of transistor 40′. This turns transistor 30 on which supplies base current to transistor 40 that, in turn, supplies base current to transistor 30. The positive feedback of base current maintains both of transistors 30 and 40 on in a latched state. The turn-on of transistor 40 interrupts the supply of base current to transistor 40′ thereby turning transistor 40′ off. When this occurs a portion of the collector current of transistor 30 is supplied via resistors 36′ and 34″ to the base of transistor 40″ turning it on. The circuit will remain in the latched state (transistors 30, 40, 40″ ON, transistor 50, 40′ off) until terminal 30 is grounded at which time the transistor states will reverse as illustrated in the table of FIG. 6. This reversal results because grounding terminal 52 will bias transistor 50 on so as to interrupt the feedback between transistor 30 and transistors 40 and 40″ which causes turn-off of transistor 40 and 40″ and enables the collector current of transistor 50 to bias transistor 40′ on.

In the examples of the invention discussed thus far, the latching transistors 30 and 40 were shown to be of complementary (NPN and PNP) types. The principles of the invention may also be applied using non-complementary latching transistors as shown in FIG. 7. This RF switch is very similar to the T-network switch of FIG. 2 except that PNP transistor 30 has been replaced by an NPN transistor 31 having an emitter electrode connected to ground, a base electrode connected via resistor 82 to the collector of transistor 40 and having a collector electrode coupled to supply terminal 32 via a collector load resistor 84. A further change is that node 18 is coupled to supply terminal 32 via resistor 36. The diode network, capacitors and bias resistors are connected to the collectors of the latching transistors as in the example of FIG. 2.

Operation of the RF switch of FIG. 7 is much the same as in FIG. 2 except that only one transistor conducts at a time rather than both being on or off. As an example, assume that transistor 40 is on. If so, the positive feedback to transistor 31 due to the cross-coupling between their collector and base electrodes will maintain transistor 31 off. For this condition, node 18 will be low, diodes 10 and 60 will be reversed biased via resistors 42 and 62 and diode 16 will be forward biased by resistor 44. Accordingly, signal flow between ports 12 and 14 will be blocked by reverse biased diodes 10 and 60 of the series branch and any leakage signal will be shunted to ground by the parallel combination of forward biased diode 16 and saturated transistor 40. Grounding the base of transistor 40 (e.g., terminal 86) will turn transistor 40 off which, in turn, will turn on transistor 31 and as a consequence the bias for diodes 16, 10 and 60 will reverse polarity thereby turning diode 16 off and diodes 10 and 60 on. For this condition an RF signal at either port will be conducted to the other. Grounding the base of transistor 31 (e.g., at terminal 88) will return the latch to its initial condition (40 ON, 31 OFF).

What is claimed is:

1. An RF switch, comprising:
   a diode network having a series branch coupled between first and second signal ports and having a shunt branch coupled between a circuit node in said series branch and a source of reference potential;
   a latching circuit comprising a pair of transistors having respective control electrodes and conduction paths cross-coupled to provide positive feedback therebetween such that each transistor of said pair controls the conductive state of the other, said latching circuit having a first state in which one transistor of said pair is conductive and a second state in which said one transistor is non-conductive;
   circuit means coupling said conduction path of said one transistor in parallel with said shunt branch of said diode network; and
   bias means, including a first impedance means coupled between an output electrode of a selected one of said transistors and a point in said series branch and a second impedance means coupled between said output electrode of said selected transistor and a point in said shunt branch, said bias means being responsive to said first state of said latching circuit, for applying forward bias to said shunt branch and reverse bias to said series branch of said diode network and responsive to said second state of said latching circuit for reversing said bias applied to said branches.

2. An RF switch as recited in claim 1 wherein said transistors are of complementary type tending to bias each other on in response to said feedback and further comprising control means coupled to said control electrode of the other one of said pair of transistors and responsive to a control signal supplied thereto for interrupting said feedback for turning said complementary transistors off.

3. An RF switch, comprising:
   a diode network having a series branch coupled between first and second signal ports and a shunt branch coupled between a circuit node in said series branch and a source of reference potential;
   a latching circuit comprising a pair of complementary transistors having respective conduction paths and control electrodes cross-coupled so as to bias both said transistors on, said conduction path of one of said complementary transistors being connected in parallel with said shunt branch of said diode network;
   a control means coupled to said latching circuit for inhibiting turn-on of said pair of transistors in response to a control signal;
   bias means responsive to turn-on of said complementary transistors for applying forward bias to said shunt branch and reverse bias to said series branch and responsive to turn-off of said complementary transistors for applying forward bias to said series branch and reverse bias to said shunt branch, and wherein
   said bias means comprises a first impedance means coupled between an output electrode of a selected one of said transistors and a point in said series branch and a second impedance means coupled between said output electrode of said selected transistor and a point in said shunt branch.

4. An RF switching circuit, comprising:
   a T-network comprising first and second diodes coupled between a circuit node and respective ones of first and second signal ports, said circuit node being coupled to a source of reference potential via a third diode;
   a latching circuit comprising first and second complementary transistors, said first transistor having a conduction path coupled in parallel with said third diode and having a control electrode coupled via the conduction path of said second transistor to a second source of reference potential, said second transistor having a control electrode coupled to said circuit node, said latching circuit having a first state in which said conduction paths are concurrently conductive and a second state in which said conduction paths are concurrently non-conductive;
   control means coupled to said control electrode of said second transistor and responsive to a control signal supplied thereto for controlling said states of said latching circuit; and
   bias means comprising resistor means coupled between an output electrode of said second transistor and each one of said first, second, and third diodes of said T-network responsive to said first state of said latching circuit for applying forward bias to said third diode and reverse bias to said first and second diodes and responsive to said second state of said latching circuit for applying reverse bias to said third diode and forward bias to said first and second diodes.

5. An RF switching circuit, comprising:
   a T-network comprising first and second diodes coupled between a circuit node and respective ones of first and second signal ports, said circuit node being coupled to a source of reference potential via a third diode;
   a latching circuit comprising first and second complementary transistors, said first transistor having a conduction path coupled in parallel with said third diode and having a control electrode coupled via the conduction path of said second transistor to a second source of reference potential, said second transistor having a control electrode coupled to said circuit node, said latching circuit having a first state in which said conduction paths are concurrently conductive and a second state in which said conduction paths are concurrently non-conductive;

control means coupled to said control electrode of said second transistor and being responsive to a control signal supplied thereto for controlling said states of said latching circuit;

bias means connected to an output electrode of said second transistor and being responsive to said first state of said latching circuit for applying forward bias to said third diode and reverse bias to said first and second diodes and responsive to said second state of said latching circuit for applying reverse bias to said third diode and forward bias to said first and second diodes, and wherein:

said first transistor is of NPN type, said second transistor is of PNP type and said control means comprises a third transistor of PNP type having emitter and collector electrodes connected to respective emitter and base electrodes of said second transistor and having a base electrode coupled to receive said control signal.

6. An RF switching circuit, comprising:

a T-network comprising first and second diodes coupled between a circuit node and respective ones of first and second signal ports, said circuit node being coupled to a source of reference potential via a third diode;

a latching circuit comprising first and second complementary transistors, said first transistor having a conduction path coupled in parallel with said third diode and having a control electrode coupled via the conduction path of said second transistor to a second source of reference potential, said second transistor having a control electrode coupled to said circuit node, said latching circuit having a first state in which said conduction paths are concurrently conductive and a second state in which said conduction paths are concurrently non-conductive;

control means coupled to said control electrode of said second transistor and being responsive to a control signal supplied thereto for controlling said states of said latching circuit;

bias means connected to an output electrode of said second transistor and being responsive to said first state of said latching circuit for applying forward bias to said third diode and reverse bias to said first and second diodes and responsive to said second state of said latching circuit for applying reverse bias to said third diode and forward bias to said first and second diodes, and wherein:

said control means comprises a third transistor having a conduction path connected between a selected one of said sources of reference potential and said control electrode of a selected one of said first and second transistors and having a control electrode connected to receive said control signal.

7. An RF switching circuit, comprising:

a T-network comprising first and second diodes coupled between a circuit node and respective ones of first and second signal ports, said circuit node being coupled to a source of reference potential via a third diode;

a latching circuit comprising first and second complementary transistors, said first transistor having a conduction path coupled in parallel with said third diode and having a control electrode coupled via the conduction path of said second transistor to a second source of reference potential, said second transistor having a control electrode coupled to said circuit node, said latching circuit having a first state in which said conduction paths are concurrently conductive and a second state in which said conduction paths are concurrently non-conductive;

controls means coupled to said control electrode of said second transistor and being responsive to a control signal supplied thereto for controlling said states of said latching circuit;

bias means connected to an output electrode of said second transistor and being responsive to said first state of said latching circuit for applying forward bias to said third diode and reverse bias to said first and second diodes and responsive to said second state of said latching circuit for applying reverse bias to said third diode and forward bias to said first and second diodes, and wherein:

said control means includes a bias signal source for applying turn-on bias to at least one of said control electrodes of said first and second transistors for initiating said first state of said latching circuit and a further transistor having a conduction path connected between one of said control electrodes and one of said sources of reference potential and having a control electrode coupled to receive said control signal, said further transistor being responsive to said control signal for placing said latching circuit in said second state when said control signal is present.

* * * * *